United States Patent
Maund

[19]

[11] Patent Number: 6,162,653
[45] Date of Patent: Dec. 19, 2000

[54] LEAD FRAME ATTACHMENT FOR OPTOELECTRONIC DEVICE

[75] Inventor: Brigg Maund, Abingdon, United Kingdom

[73] Assignee: Bookham Technology, PLC, United Kingdom

[21] Appl. No.: 09/159,256

[22] Filed: Sep. 23, 1998

[30] Foreign Application Priority Data

Jul. 30, 1998 [GB] United Kingdom ............... 9816692

[51] Int. Cl.$^7$ .......................... H01L 21/00; H01L 33/00; H01L 23/34

[52] U.S. Cl. ................ 438/27; 438/31; 257/98; 257/728

[58] Field of Search .................. 438/27, 31; 257/98, 257/676, 728, 673

[56] References Cited

U.S. PATENT DOCUMENTS

| | | | |
|---|---|---|---|
| 3,757,127 | 9/1973 | Dhaka | 250/227 |
| 4,843,188 | 6/1989 | Patterson | 174/52.4 |
| 5,079,190 | 1/1992 | Mihara | 437/220 |
| 5,120,678 | 6/1992 | Moore et al. | 437/183 |
| 5,340,771 | 8/1994 | Rostoker | 437/209 |
| 5,640,048 | 6/1997 | Selna | 257/738 |
| 5,655,041 | 8/1997 | Forrest | 385/49 |
| 5,753,857 | 5/1998 | Choi | 174/52.4 |
| 5,793,101 | 8/1998 | Kuhn | 257/676 |

FOREIGN PATENT DOCUMENTS

| | | |
|---|---|---|
| 0562550A1 | 9/1993 | European Pat. Off. . |
| 0579438A2 | 1/1994 | European Pat. Off. . |
| 2307596 | 5/1997 | United Kingdom . |
| WO84/01057 | 3/1984 | WIPO . |

OTHER PUBLICATIONS

Patent Abstracts of Japan, Publication #59047774, Publication Date—Mar. 17, 1984, Title: "Photo Semiconductor Device" p. 1.

International Search Report, Application No. PCT/GB99/01970, Date—Sep. 29, 1999.

U.K. Search Report for application No. GB 9816692.9; dated Nov. 10, 1998.

*Primary Examiner*—Charles Bowers
*Assistant Examiner*—Nema Berezny
*Attorney, Agent, or Firm*—Cook, Alex, McFarron, Manzo, Cummings & Mehler, Ltd.

[57] ABSTRACT

An optoelectronic device is mounted on a planar substrate in electrical connection with solder bumps adjacent an edge of the substrate and connection to a lead frame is made by loading the edge of the substrate on a lead frame support with lead frame conductors in engagement with the solder bumps and applying heat to melt the solder.

12 Claims, 3 Drawing Sheets

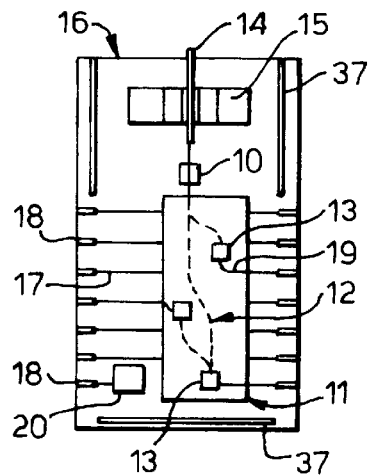
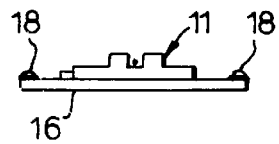
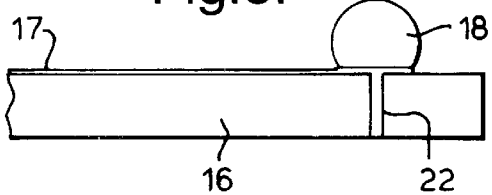
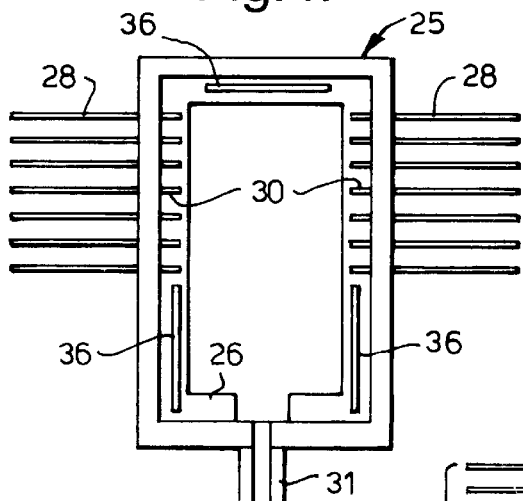
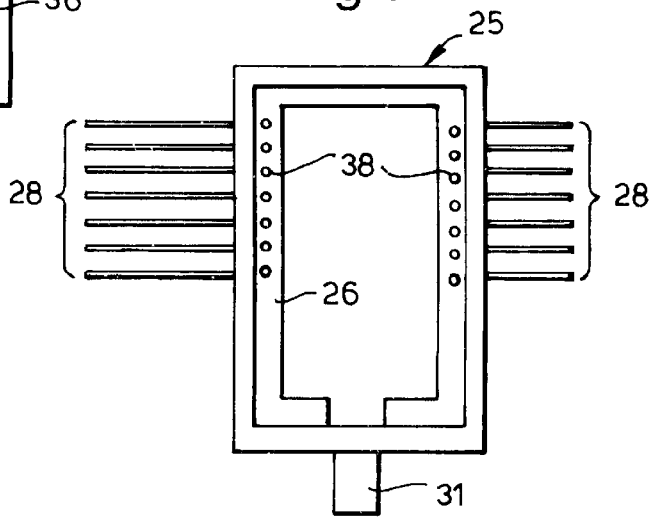

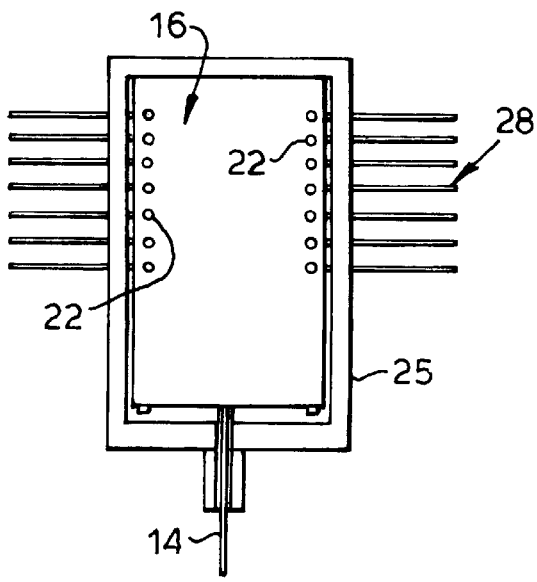
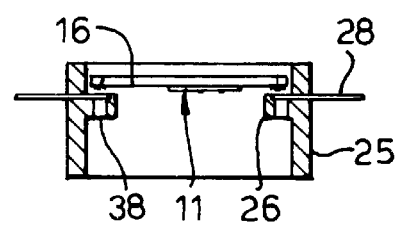
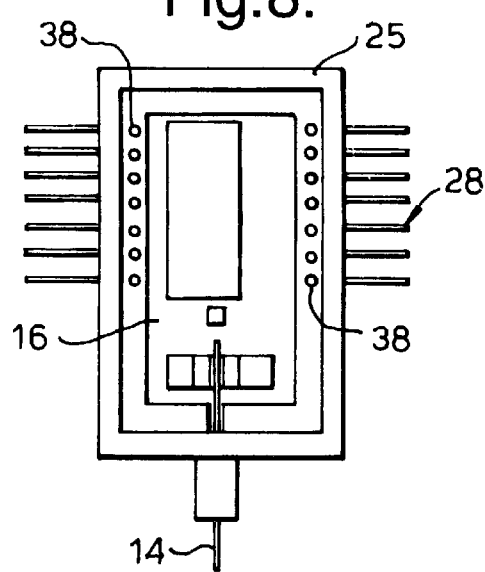
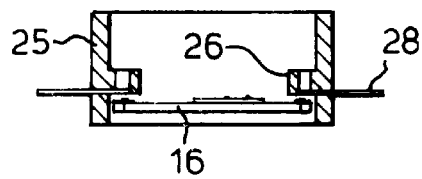

LEAD FRAME ATTACHMENT FOR OPTOELECTRONIC DEVICE

The invention relates to a method and apparatus or lead frame attachment to an optoelectronic device.

BACKGROUND OF THE INVENTION

Optoelectronic devices are known. For example, integrated silicon waveguide devices, which are mounted on a rigid substrate prior to connecting to an electrical lead frame assembly and encapsulation to form a sealed product. In the case of integrated silicon waveguide devices having a connection to an optical fibre system, it is important to obtain and maintain correct position and orientation of the waveguide device with the optical fibre. It may also be necessary to form electrical connections to the device from a lead frame assembly and to package the assembly in a sealed manner so as to prevent degradation of operation of the optoelectronic device. For this reason integrated silicon waveguide devices may be mounted on a high mechanical modulus substrate such as a ceramic substrate. It has been known to locate such substrates within a premoulded encapsulating casing and to form electrical connections between conductors on the substrate and conductors of a lead frame assembly. Known techniques for interconnection of a ceramic substrate have involved wire bonding from the substrate to the lead frame. This may represent a second wire bonding operation in cases where the optoelectronic device has itself required a first wire bonding operation to connect electrical devices to a conducting network on the substrate. In cases where the substrate is located within the walls of a package, restricted access can present problems in making wire bonded connections inside the walls of the package. Furthermore there may be reduced electrical performance due to the length of wire bonds necessary to connect the substrate to the lead frame.

It is an object of the present invention to provide improved method and apparatus for connecting a supporting substrate to a lead frame particularly when forming an enclosed package.

SUMMARY OF THE INVENTION

The invention provides a method of connecting an optoelectronic device to a lead frame assembly comprising mounting the optoelectronic device on a planar substrate having electrical connecting circuitry for connection to the optoelectronic device, connecting said device to said connecting circuitry, providing a plurality of solder bumps on a major face of the substrate adjacent an edge of the face, the solder bumps being in electrical connection with said connecting circuitry, mounting the substrate on a lead frame support which engages said major face adjacent its periphery, said lead frame support having lead frame conductors exposed on said support so as to contact said solder bumps, and applying heat to melt the solder and thereby form secure electrical connections between the lead frame conductors and the solder bumps.

Preferably said lead frame support forms part of a casing which is positioned around the substrate and which is sealed to enclose the optoelectronic device.

Preferably the lead frame support forms part of a mould which surrounds the substrate and the method includes moulding encapsulating material in the mould around the optoelectronic device and substrate to form a sealed product. Alternatively the lead frame is sealed using an adhesive lid.

Preferably the solder bumps are located on a peripheral region of the substrate between the optoelectronic device and said edge of the face so as to overlie the lead frame conductors when positioned on the lead frame support.

Preferably the solder bumps are provided on the same major face of the substrate as the optoelectronic device and said substrate is inverted to locate the solder bumps under the substrate when the substrate is mounted on the lead frame support.

Preferably pressure as well as heat is applied to urge the substrate into engagement with the lead frame support to cause the solder bumps to form secure electrical connection with the lead frame conductors.

Preferably thermal access passages are provided through the thickness of said substrate adjacent said solder bumps and heat is transferred through said passages to melt the solder when connecting the substrate to the lead frame.

Thermal access passages may be provided through the lead frame support and heat is transferred through the passages in the lead frame support to melt the solder when connecting the substrate to the lead frame.

The substrate may comprise a rigid support providing a connection of fixed relationship of position and direction between an optical fibre and an integrated optical waveguide device which may include an optoelectrical light source or receiver and forming at least part of said optoelectronic device.

The optoelectronic device may comprise an integrated silicon chip providing an optical waveguide and may include an optoelectrical light source and/or receiver.

Preferably the substrate is a ceramic substrate.

The invention includes an optoelectronic assembly comprising a planar substrate having electrical connecting circuitry, and an optoelectronic device mounted on said planar substrate and having electrical connection to said electrical connecting circuitry, said substrate being provided with a plurality of solder bumps on a major face of the planar support adjacent an edge of the planar support, said solder bumps being in electrical connection with said electrical connecting circuitry, whereby said assembly may be located on a lead frame support with said solder bumps in engagement with lead frame conductors for securing thereto by application of heat.

The invention includes an optoelectronic assembly as aforesaid together with a lead frame assembly comprising a lead frame support with a plurality of lead frame conductors thereon, said support engaging the solder bumps of the planar substrate so that the lead frame conductors are secured to respective solder bumps by heat treatment of the solder bumps.

BRIEF DESCRIPTION OF THE DRAWINGS

FIG. 1 is a top plan view of an optoelectronic device mounted on a substrate in accordance with the present invention, FIG. 2 is a section through the thickness of the assembly shown in FIG. 1, FIG. 3 is an enlarged view of a peripheral region of the substrate used in FIGS. 1 and 2, FIG. 4 is a top plan view of a lead frame and mould assembly for use in accordance with the invention, FIG. 5 is an underplan view of the assembly of FIG. 4, FIG. 6 is a top plan view of the assembly of FIG. 4 when an optoelectronic device has been located in the mould, FIG. 7 is a section across the assembly of FIG. 6, FIG. 8 is an underplan view of the assembly of FIG. 6, FIG. 9 is a section across FIG. 8.

DESCRIPTION OF THE PREFERRED EMBODIMENTS

Figure 10:
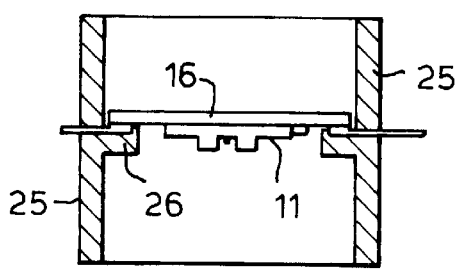
FIG. 10 shows an alternative structure of lead frame and mould used with an optoelectronic device of the type shown in FIG. 1.

This example relates to the connection of an optoelectronic device to a lead frame in a sealed enclosure. The optoelectronic device may comprise an integrated silicon waveguide device of the type shown in our UK Patent 2307786. Such a device is shown in FIG. 1 and marked 11. The device is formed as an integrated silicon chip having thereon one or more waveguides 12 interconnecting optoelectrical devices 13 such as laser diodes or photodiodes. The optical waveguides 12 are connected to an external optical fibre 14 which passes through a feeder channel 15 and is secured on an angled support pad 10 to give the required position and orientation for the connection between the fibre 14 and the waveguides 12 on the chip 11.

To maintain the correct positioning of the optical fibre 14 and silicon chip 11 they are both mounted on a planar substrate 16 which in this example is a high mechanical modulus material formed as a ceramic planar substrate. The substrate is provided with electrical connecting circuitry in the form of a plurality of leads 17 which extend across the substrate to provide an interconnection between the electrical devices on the chip 11 and external contact points 18 on the substrate. Firstly the chip 11 is fixed in known manner in a secure position on the substrate 16 and a first wire bonding operation interconnects the devices 13 by wires 19 to the array of leads 17 on the substrate. The substrate itself may have mounted thereon additional electronic devices such as that marked 20 and this is in turn connected to one of the external connections 18 on the substrate.

In this example the external electrical connections 18 are formed as solder bumps located on the upper major face of the substrate 16. The chip 11 is also secured on the same upper major face of the substrate 16 and is positioned away from the edges of the substrate so that the solder bumps 18 lie on the major face adjacent edges of the substrate and are located between the chip 11 and the edges of the substrate. This is shown more clearly in FIG. 3 which shows an enlarged view of one solder bump 18 mounted on the substrate 16 and the electrical lead 17 forming a connection with the solder bump 18 is seen extending across the upper surface of the substrate 16. A thermal passage 22 is provided through the thickness of the substrate 16 adjacent each of the solder bumps 18 so that heat may be transferred through the thermal passage to the solder bump when attaching the assembly to the lead frame. The passageway 22 may be a hollow passage or contain a heat conductor of high thermal conductivity. To mount the device of FIGS. 1 and 2, a lead frame and mould assembly is provided as shown in FIGS. 4 and 5. FIG. 4 shows a rectangular mould wall 25 having on its inner face a lead frame support in the form of a shelf 26. The shelf 26 surrounds a hollow space and provides a shoulder on which the substrate 16 of FIG. 1 may be supported. An array of lead frame conducting wires 28 extend through the wall 25 on two opposite sides of the rectangular frame and have exposed conductors 30 on the upper surface of the shelf 26. At one end of the frame a projecting channel 31 is provided to hold the optical fibre 14 in position when the assembly of FIG. 1 is located in the frame of FIG. 4. The assembly of FIG. 1 is inverted so that the chip 11 is on the underface of the substrate 16 and the assembly of FIG. 1 then drops into position in the frame of FIG. 4 so that the frame closely surrounds the substrate with the peripheral regions of the major face of the substrate resting on the shoulder 26. The solder bumps 18 are then resting in face to face engagement with respective wire ends 30 of the lead frame conductors. As shown in FIG. 4 additional bonding strips 36 are provided on the shelf 26 and arranged to engage mating bonding strips 37 on the substrate 16 (shown in FIG. 1). This assists in securing the substrate 16 in the required position with the solder bumps 18 engaging respective lead frame wire ends 30.

As shown in FIG. 5, the shelf 26 seen from the underside has a plurality of thermal passageways 38 provided through the thickness of the shelf 26 immediately below respective conductor ends 30. When the substrate 16 is located in position, heat and pressure is applied to urge the substrate 16 into contact with the shelf 26 and melt the solder bumps 18 so as to form a secure electrical connection between the solder bumps 18 and respective conductors of the lead frame assembly. When the heat and pressure is removed the solder will solidify leaving permanent electrical connections with the components maintained in their required relative positions.

This operation is illustrated in FIGS. 6 to 9. FIG. 6 shows an assembly similar to that of FIG. 1 when it has been inverted and dropped into position in the mould and lead frame assembly of the type shown in FIG. 4. As the chip has been inverted FIG. 6 shows the underface of the substrate 16 and in the particular arrangement shown in FIG. 6 the substrate 16 has thermal passages 22 through the thickness of the substrate to assist in the passage of heat to melt the solder bumps 18 during the bonding operation. The thermal passages 22 provided in the substrate may be in addition to the thermal passages 38 provided through the shelf of the frame 25. FIG. 7 shows the passages 38 through the shelf 26 lying below the substrate 16. As illustrated in FIG. 7 the shelf 26 is positioned partway between the opposite ends of the frame so that when the substrate 16 is located in position with the chip 11 on its underface, the contents of the frame are spaced inwardly from the ends so that encapsulating material may be added on both sides of the substrate 16 to encapsulate the assembly and seal the optoelectronic device against the external environment. FIG. 8 shows the underplan view of the assembly in FIG. 6 and is similar to the view of FIG. 5 with the substrate and chip in position. FIG. 9 illustrates the same assembly as FIG. 7 but turned back to the position in which the substrate 16 lies below the chip 11.

It will be appreciated that by using the solder bump array which overlies the ends of the lead frame conductors 28 in face to face engagement with them, there is no requirement for a second wire bonding operation which would extend the lateral extent of wires from the substrate 16. Furthermore there is no requirement for the insertion of any wire bonding tool between the edges of the substrate 16 and the surrounding frame 25. Consequently access is not a problem as the heat and pressure is applied through the top and bottom open ends of the frame 25 through which access is not restricted. It will be understood that the bonds with a plurality, and preferably with all, of the solder bumps 18 are formed simultaneously by a single operation.

Figure 11:
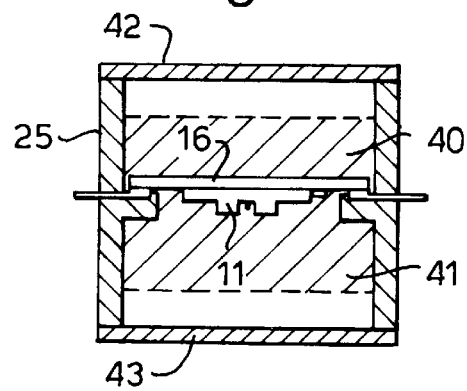
FIG. 11 shows the assembly of FIG. 10 when encapsulating material has been used and the mould sealed by lids.
Figure 12:
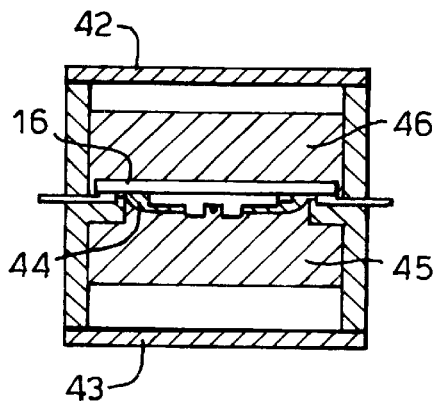
FIG. 12 shows a variation of FIG. 11 in which different types of encapsulation have been used.
Figure 13:
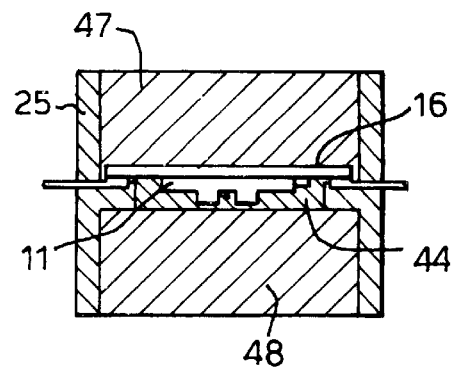
FIG. 13 shows a further variation of encapsulation without lids at the mould ends.

Once the bonding has taken place, the package may be sealed in a variety of different ways. The atmosphere within the frame may be purged to provide an inert atmosphere. The starting point for this is illustrated in one example in FIG. 10 when the assembly has been secured in position but no material has been added to either end of the frame 25 to seal the unit. The substrate and chip 11 may be surrounded with a silicone encapsulant material such as is illustrated by 40 and 41 on both sides of the substrate 16 in FIG. 11. Such silicone material may totally encapsulate the substrate 16 and chip 11 although it need not necessarily fill the frame 25 to reach both ends of the frame. The package may be sealed by upper and lower lids 42 and 43 as illustrated in FIG. 11. As an alternative epoxy resin may be used to fill or partially fill the cavity within the frame 25. In FIG. 12 a silicone layer 44 has been used to cover the major face of the substrate on which the chip 11 is mounted. In that way the chip itself is secured within a silicone encapsulant. Epoxy resin is then used as indicated at 45 and 46 to partially fill opposite sides of the frame on both sides of the substrate 16. Lids 42 and 43 enclose the package as already described with reference to FIG. 11 in the case of an alternative arrangement shown in FIG. 13 the face of the substrate 16 on which the chip 11 is mounted is encased in a silicone layer 44 similar to that shown in FIG. 12. In this case the remainder of the cavity within the mould frame 25 is filled with epoxy material 47 and 48 on opposite sides of the substrate 16 so that the frame is completely filled with epoxy resin flush with opposite ends of the package. In such an arrangement no additional lids 42 and 43 are required.

The invention is not limited to the details of the foregoing examples.

What is claimed is:

1. A method of connecting an optoelectronic waveguide device to a lead frame assembly comprising mounting the optoelectronic waveguide device on a planar substrate having electrical connecting circuitry for connection to the optoelectronic waveguide device, connecting said device to said connecting circuitry, providing a plurality of solder bumps on a major face of the substrate adjacent an edge of the face, the solder bumps being in electrical connection with said connecting circuitry, mounting the substrate on a lead frame support which engages said major face adjacent its periphery, said lead frame support having lead frame conductors exposed on said support so as to contact said solder bumps, and applying heat to melt the solder and thereby form secure electrical connections between the lead frame conductors and the solder bumps.

2. A method according to claim 1 in which heat to melt the solder is applied to a plurality of solder bumps simultaneously to bond the bumps to respective lead frame conductors in a single operation.

3. A method according to claim 1 in which said lead frame support forms part of a casing which is positioned around the substrate and which is sealed to enclose the optoelectronic device.

4. A method according to claim 3 in which the lead frame support forms part of a mould which surrounds the substrate and the method includes moulding encapsulating material in the mould around the optoelectronic device and substrate to form a sealed product.

5. A method according to claim 1 in which the solder bumps are located on a peripheral region of the substrate between the optoelectronic device and said edge of the face so as to overlie the lead frame conductors when positioned on the lead frame support.

6. A method according to claim 5 in which the solder bumps are provided on the same major face of the substrate as the optoelectronic device and said substrate is inverted to locate the solder bumps under the substrate when the substrate is mounted on the lead frame support.

7. A method according to claim 5 in which pressure as well as heat is applied to urge the substrate into engagement with the lead frame support to cause the solder bumps to form secure electrical connection with the lead frame conductors.

8. A method according to claim 5 in which thermal access passages are provided through the thickness of said substrate adjacent said solder bumps and heat is transferred through said passages to melt the solder when connecting the substrate to the lead frame.

9. A method according to claim 5 in which thermal access passages are provided through the lead frame support and heat is transferred through the passages in the lead frame support to melt the solder when connecting the substrate to the lead frame.

10. A method according to claim 1 in which the substrate comprises a rigid support providing a connection of fixed relationship of position and direction between an optical fibre and an integrated optical waveguide device including at least one optoelectrical light source or receiver and forming at least part of said optoelectronic device.

11. A method according to claim 10 in which the optoelectronic device comprises an integrated silicon chip providing an optical waveguide and including an optoelectrical light source and/or receiver.

12. A method according to claim 10 in which the substrate is a ceramic substrate.

* * * * *